United States Patent
Chae et al.

(12) 
(10) Patent No.: US 6,691,289 B2
(45) Date of Patent: Feb. 10, 2004

(54) SEMICONDUCTOR INTEGRATED CIRCUIT INCLUDING CIRCUIT FOR SELECTING EMBEDDED TAP CORES

(75) Inventors: Eun-seok Chae, Gunpo (KR); Gyoo-chan Sim, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/086,144

(22) Filed: Feb. 28, 2002

(65) Prior Publication Data

US 2003/0018944 A1 Jan. 23, 2003

(30) Foreign Application Priority Data

Jul. 13, 2001 (KR) ........................ 2001-42356

(51) Int. Cl.⁷ .............................................. G06F 17/50
(52) U.S. Cl. ................................. 716/4; 716/5; 716/6
(58) Field of Search ........................... 716/4–6; 714/30, 714/724, 726, 727, 733, 734; 713/500

(56) References Cited

U.S. PATENT DOCUMENTS

| 5,768,289 A | 6/1998 | James ..................... 371/22.32 |
| 5,828,825 A | 10/1998 | Eskandari et al. ..... 395/183.03 |

(List continued on next page.)

FOREIGN PATENT DOCUMENTS

| JP | 11-83949 | 7/1989 | ............ H04M/3/56 |
| JP | 11-166961 | 6/1999 | ........... G01R/31/28 |
| JP | 11-258304 | 10/1999 | ....... G01R/31/3177 |
| JP | 00-258504 | 9/2000 | ........... G01R/31/28 |
| JP | 2000-258504 | 9/2000 | ........... G01R/31/28 |
| JP | 2000-284024 | 10/2000 | ........... G01R/31/28 |
| KR | 01-0048756 | 6/2001 | ........... G11C/11/40 |

OTHER PUBLICATIONS

Whetsel, Lee, An IEEE 1149.1 Based Test Access Architecture For ICs With Embedded Cores, Texas Instruments.*
IEEE Std 1149. Jan. 1990, IEEE Std Test Access Port and Boundary–Scan Architecture, IEEE Computer Society, Sep. 22, 1994.*
Whetsel, L., "An IEEE 1149.1 Based Test Access Architecture For ICs with Embedded Cores," International Test Conference, 1997, pp. 69–78.
Oakland Steven, F., Considerations for Implementing IEEE 1149.1 on System–on–a–Chip Integrated Circuits, ITC International Test Conference, 2000, pp. 628–637.
Bhattacharya, D., Hierarchical Test Access Architecture for Embedded Cores in an Integrated Circuit, Texas Instruments Incorporated.
Bhattacharya, D., "Instruction–Driven Wake–Up Mechanisms for Snoopy TAP Controller," Texas Instruments Incorporated.

*Primary Examiner*—Vuthe Siek
*Assistant Examiner*—Naum B Levin
(74) *Attorney, Agent, or Firm*—Mills & Onello LLP

(57) ABSTRACT

A semiconductor integrated circuit satisfying the IEEE 1149.1 standard and allowing all test access port (TAP) cores embedded in a chip to be tested on a circuit board as well as on a chip is provided. The semiconductor integrated circuit includes a plurality of TAP cores sharing a test data input pin, a test mode selection signal input pin, a test reset signal input pin, and a test clock signal input pin. An input port of a boundary scan register circuit is connected to the test data input pin. Input ports of a selection signal generating circuit are connected to the test data input pin, the test reset signal input pin, and the test clock signal input pin. The selection signal generating circuit generates selection signals for selecting one of the plurality of TAP cores and the boundary scan register circuit in response to signals input through these input pins. A selector selects one of the outputs of the plurality of TAP cores and the boundary scan register circuit in response to the selection signals and outputs the selection to an output pin.

6 Claims, 5 Drawing Sheets

U.S. PATENT DOCUMENTS

| | | | |
|---|---|---|---|
| 5,862,152 A | 1/1999 | Handly et al. | 371/22.32 |
| 6,000,051 A | 12/1999 | Nadeau-Dostie et al. | 714/727 |
| 6,058,255 A | 5/2000 | Jordan | 395/500.05 |
| 6,073,254 A * | 6/2000 | Whetsel | 714/30 |
| 6,385,749 B1 * | 5/2002 | Adusumilli et al. | 714/733 |
| 6,425,100 B1 * | 7/2002 | Bhattacharya | 714/724 |
| 6,539,491 B1 * | 3/2003 | Skergan et al. | 713/500 |

* cited by examiner

SEMICONDUCTOR INTEGRATED CIRCUIT INCLUDING CIRCUIT FOR SELECTING EMBEDDED TAP CORES

BACKGROUND OF THE INVENTION

1. Field of the Invention

The present invention relates to a semiconductor integrated circuit, and more particularly, to a semiconductor integrated circuit including dedicated test access port (TAP) cores.

2. Description of the Related Art

As a result of development in technology related to semiconductor fabrication and integrated circuits, System On a Chip (SOC) was proposed. Recently, as SOC design has been universally adopted, a plurality of cores are embedded in a single chip. To test these cores, a boundary scan method complying with the IEEE 1149.1 standard is usually used. A core having a boundary scan circuit is usually referred to as a TAP core. The IEEE 1149.1 standard defines using four test input pins and one test output pin to test a TAP core on a board.

A variety of designs for effectively testing a plurality of TAP cores embedded in a single chip have been proposed. Most general methods are ad-hoc TAP core integration methods as shown in FIGS. 1 and 2.

FIG. 1 is a diagram of a conventional integrated circuit realized according to a method using a dedicated test access port (TAP). Here, two TAP cores 11 and 13 are embedded in a single chip 100.

Referring to FIG. 1, each TAP core is connected to four test input pins and one test output pin. Specifically, input ports of the TAP core 11 are connected to four input pins TDI_A, TMS_A, TRST_A, and TCK_A of the chip 100, and an output port of the TAP core 11 is connected to an output pin TDO_A of the chip 100. Input ports of the TAP core 13 are connected to four input pins TDI_B, TMS_B, TRST_B, and TCK_B of the chip 100, and an output port of the TAP core 13 is connected to one input port of a multiplexer 15. The output port of the multiplexer is connected to another output pin TDO_B of the chip 100.

The input pins TDI_A, TMS_A, TRST_A, TCK_A, TDI_B, TMS_B, TRST_B, and TCK_B are pins defined by the IEEE 1149.1 standard. The input pins TDI_A and TDI_B are serial test data input pins. The input pins TMS_A and TMS_B are test mode selection signal input pins. The input pins TRST_A and TRST_B are test reset signal input pins. The input pins TCK_A and TCK_B are test clock signal input pins. The output pin TDO_B is a test data output pin.

An input port of a boundary scan register circuit 17 is connected to the data input pin TDI_B connected to an input port of the TAP core 13. An output port of the boundary scan register circuit 17 is connected to an input port of the multiplexer 15. The boundary scan register circuit 17 and the multiplexer 15 are connected to the TAP core 13 in FIG. 1. However, they may be connected to the TAP core 11. The boundary scan register circuit 17 can be controlled by the TAP core 11 or the TAP core 13.

The integrated circuit shown in FIG. 1 is advantageous in that the two TAP cores 11 and 13 can be independently controlled and tested by using four test input pins and one test output pin, which correspond to each of the TAP cores 11 and 13, during a chip test. In addition, only four input pins TDI_B, TMS_B, TRST_B, and TCK_B and one output pin TDO_B, which are related to the TAP core 13 connected to the boundary scan register circuit 17, are used on a board, thereby satisfying the IEEE 1149.1 standard.

However, on the board, only the TAP core 13 connected to the boundary scan register circuit 17 can be tested. Moreover, as the number of TAP cores increases, the number of input pins and output pins of the chip 100 increases.

FIG. 2 is a diagram of a conventional integrated circuit realized according to a method using pin sharing. Here, two TAP cores 21 and 23 are embedded in a single chip 200.

Referring to FIG. 2, four test input pins TDI, TMS, TRST, and TCK and one test output pin TDO of the chip 200 are shared by the two TAP cores 21 and 23. Input ports of the TAP core 21 and input ports of the TAP core 23 are commonly connected to the input pins TDI, TMS, TRST, and TCK. An output port of the TAP core 21 is connected to an input port of a multiplexer 25, and an output port of the TAP core 23 is connected to another input port of the multiplexer 25. An output port of the multiplexer 25 is connected to the output pin TDO of the chip 200.

The input pins TDI, TMS, TRST, and TCK are pins defined by the IEEE 1149.1 standard, as described in FIG. 1. The input pin TDI is a serial test data input pin. The input pin TMS is a test mode selection signal input pin. The input pin TRST is a test reset signal input pin. The input pin TCK is a test clock signal input pin. The output pin TDO is a test data output pin.

An input port of a boundary scan register circuit 27 is connected to the data input pin TDI shared by the TAP core 21 and the TAP core 23, and an output port of the boundary scan register circuit 27 is connected to a third input port of the multiplexer 25. The control port of the multiplexer 25 is connected to a control pin CONTROL of the chip 200. The multiplexer 25 selects one of the outputs of the TAP cores 21 and 23 and the boundary scan register circuit 27 in response to a signal applied to the control pin CONTROL. Here, the boundary scan register circuit 27 can be controlled by the TAP core 21 or the TAP core 23.

In the integrated circuit shown in FIG. 2, since the input pins TDI, TMS, TRST, and TCK and the output pin TDO are shared by the plurality of TAP cores 21 and 23, the number of the input pins and output pins of the chip 200 does not increase even when the number of TAP cores increases. However, the control pin CONTROL is additionally installed, which does not satisfy the IEEE 1149.1 standard.

If the control pin CONTROL is fixed to a predetermined value so that only a specified one of the TAP cores 21 and 23 can always be selected on a board, the IEEE 1149.1 standard can be satisfied. However, under these conditions, an unselected TAP core cannot be accessed.

SUMMARY OF THE INVENTION

To solve the above-described problems, it is an object of the present invention to provide a semiconductor integrated circuit satisfying the IEEE 1149.1 standard and allowing all test access port (TAP) cores embedded in a chip to be tested on a circuit board as well as on a chip.

In accordance with the invention, there is provided a semiconductor integrated circuit including a plurality of TAP cores, a boundary scan register circuit, a selection signal generating circuit, and a selector. The plurality of TAP cores share a predetermined number of input pins. The boundary scan register circuit has an input port connected to one of the input pins. The selection signal generating circuit has input ports connected to some of the input pins and generates selection signals for selecting one of the plurality of TAP cores and the boundary scan register circuit in response to signals input through the input ports connected to these input pins. The selector selects one of the outputs of the plurality of TAP cores and the boundary scan register circuit in response to the selection signals and outputs the selection to an output pin.

In one embodiment, the TAP cores share four input pins. The shared pins include a test data input pin, a test mode selection signal input pin, a test reset signal input pin, and a test clock signal input pin. An input port of the boundary scan register circuit can be connected to the test data input pin.

Input ports of the selection signal generating circuit can be connected to the test data input pin, the test reset signal input pin, and the test clock signal input pin. Alternatively, the input ports of the selection signal generating circuit can be connected to the test mode selection signal input pin, the test reset signal input pin and the test clock signal input pin. That is, instead of the test data input pin, the test mode selection signal input pin may be connected to the selection signal generating circuit. The selector selects one among the outputs of the plurality of TAP cores and the boundary scan register circuit in response to the selection signals and outputs the selection to an output pin.

In one embodiment, the selection signal generating circuit includes a shift register circuit for sequentially shifting data input through the test data input pin or the test mode selection signal input pin in response to a clock signal input through the test clock signal input pin, and a latch circuit for latching the data of the shift register circuit in response to a reset signal input through the test reset signal input pin and outputting the latched data as the selection signals.

In one embodiment, the selector is a multiplexer.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
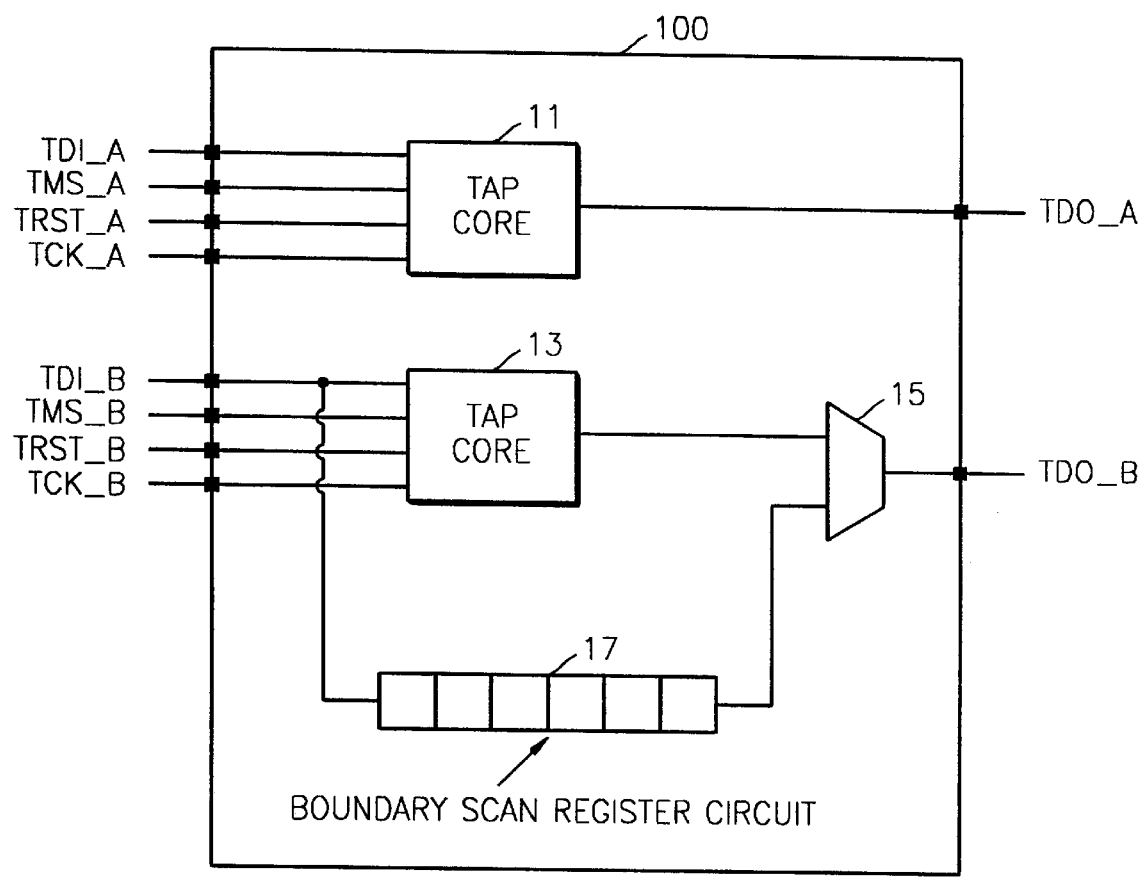
FIG. 1 is a diagram of a conventional integrated circuit realized according to a method using a dedicated test access port (TAP).
Figure 2:
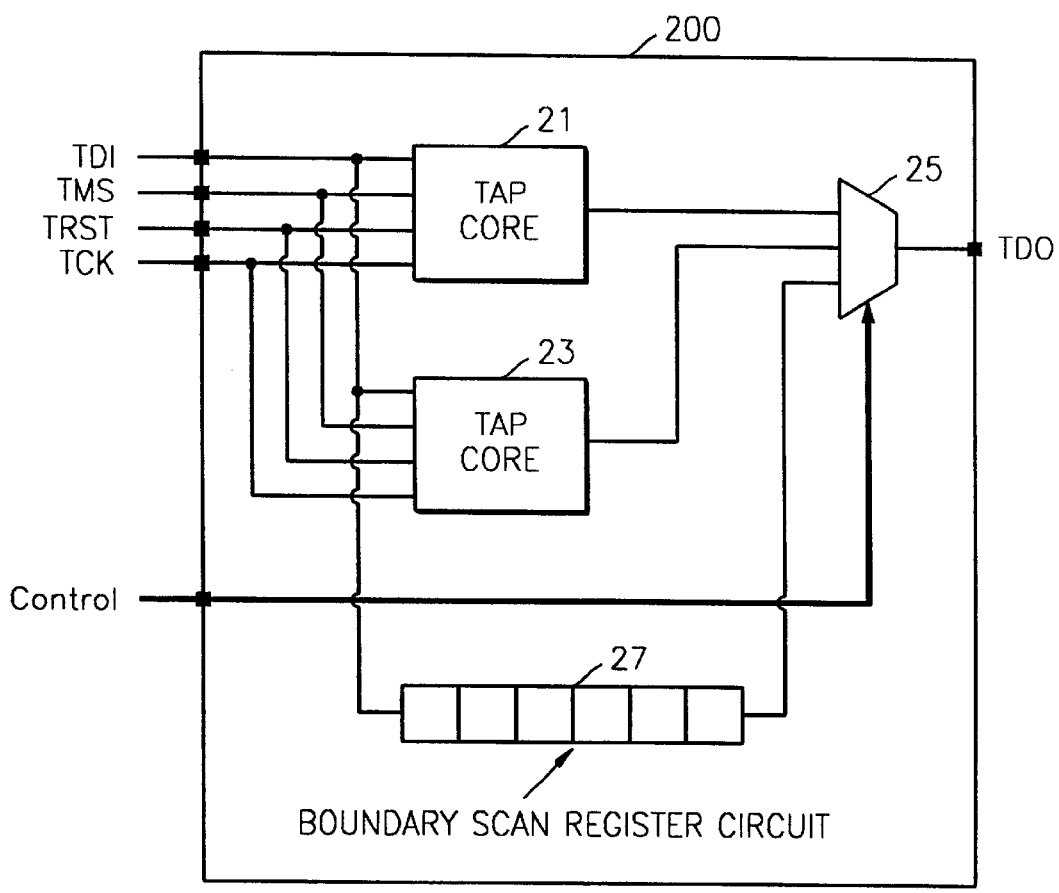
FIG. 2 is a diagram of a conventional integrated circuit realized according to a method using pin sharing.
Figure 3:
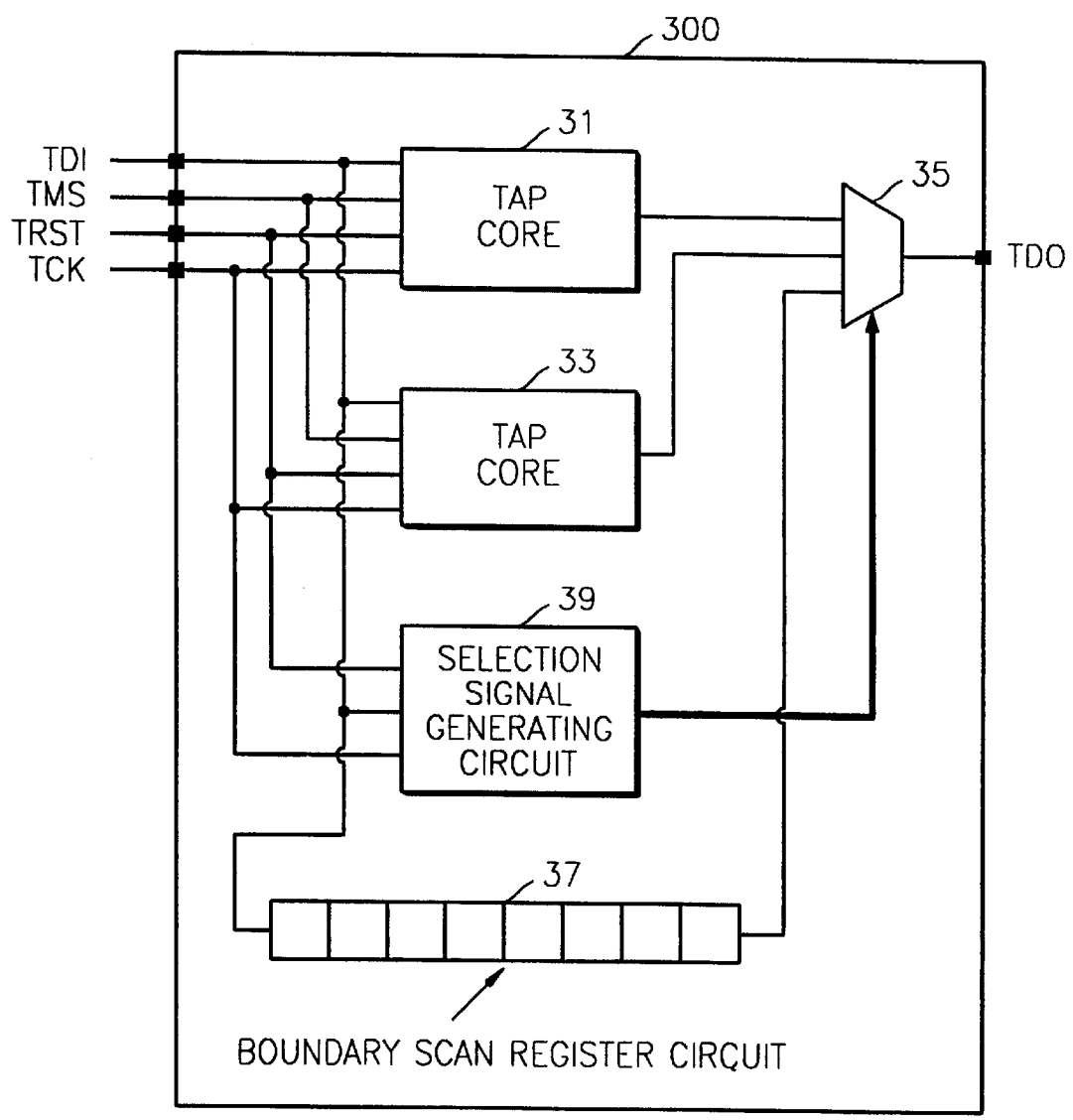
FIG. 3 is a semiconductor integrated circuit according to an embodiment of the present invention.

FIG. 3 is a semiconductor integrated circuit according to an embodiment of the present invention. Referring to FIG. 3, the semiconductor integrated circuit 300 includes a plurality of test access port (TAP) cores 31 and 33, a boundary scan register circuit 37, a selection signal generating circuit 39, and selector 35. Here, two TAP cores are shown as an example. That is, the invention is generally applicable to any number of TAP cores.

The TAP cores 31 and 33 share four input pins TDI, TMS, TRST, and TCK. The input pins TDI, TMS, TRST, and TCK and an output pin TDO are pins defined by the IEEE 1149.1 standard. The input pin TDI is a serial test data input pin. The input pin TMS is a test mode selection signal input pin. The input pin TRST is a test reset signal input pin. The input pin TCK is a test clock signal input pin. The output pin TDO is a test data output pin.

An input port of the boundary scan register circuit 37 is connected to the data input pin TDI. Input ports of the selection signal generating circuit 39 are connected to the data input pin TDI, the reset signal input pin TRST, and the clock signal input pin TCK. The selection signal generating circuit 39 generates selection signals for selecting one among the TAP cores 31 and 33 and the boundary scan register circuit 37 in response to signals input through these pins. Instead of the data input pin TDI, the test mode selection signal input pin TMS may be connected to the selection signal generating circuit 39.

The selector 35 selects one among the outputs of the TAP cores 31 and 33 and the boundary scan register circuit 37 in response to the selection signals and outputs the selection to the output pin TDO. Here, the boundary scan register circuit 37 may be controlled by the TAP core 31 or the TAP core 33. The selector 35 is realized as a multiplexer.

Figure 4:
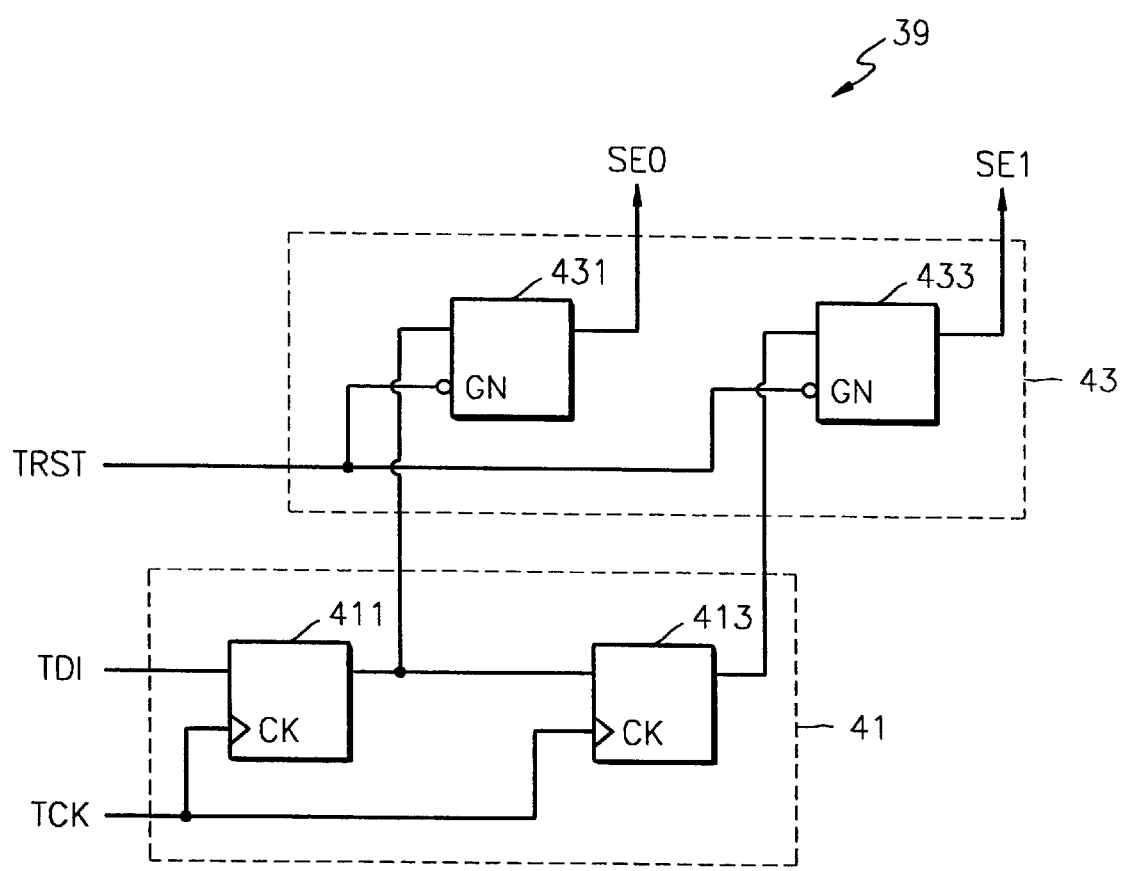
FIG. 4 is a detailed diagram of a selection signal generating circuit shown in FIG. 3.

FIG. 4 is a detailed diagram of the selection signal generating circuit 39 shown in FIG. 3. Referring to FIG. 4, the selection signal generating circuit 39 includes a shift register circuit 41 and a latch circuit 43.

The shift register circuit 41 sequentially shifts data input through the data input pin TDI in response to a clock signal input through the clock signal input pin TCK. The shift register circuit 41 is composed of flip-flops 411 and 413 and shifts data at a rising edge of a clock signal. Here, the number of flip-flops is given by $\log_2(N)$, where N denotes the number of TAP cores. For example, when N is 2, the number of necessary flip-flops is 2, and when N is 5, the number of necessary flip-flops is 3.

The latch circuit 43 latches data from the shift register circuit 41 in response to a reset signal input through the test reset signal input pin TRST and outputs the latched data in parallel as selection signals SE0 and SE1. Hence, the latch circuit 43 maintains a previous latched value when the reset signal is logic high and latches the data from the shift register 41 when the reset signal is logic low. The latch circuit 43 is composed of latches 431 and 433. The number of latches is given by $\log_2(N)$, where N denotes the number of TAP cores.

When the selection signals SE0 and SE1 are generated, the selector 35 shown in FIG. 3 selects one among the outputs of the TAP cores 31 and 33 and the boundary scan register circuit 37 in response to the selection signals SE0 and SE1 and outputs the selection to the output pin TDO. Here, the selector 35 is configured to select one among the outputs of the TAP cores 31 and 33 and the boundary scan register circuit 37 according to the logical values of the selection signals SE0 and SE1. An example of the configuration is shown in Table 1.

TABLE 1

| SE0 | SE1 | Selection |
|---|---|---|
| 0 | 0 | TAP core 31 |
| 0 | 1 | TAP core 33 |
| 1 | 0 | Boundary scan register circuit 37 |
| 1 | 1 | Boundary scan register circuit 37 |

The operation of a semiconductor integrated circuit according to the embodiment of the present invention will be described further with reference to FIGS. 3 and 4. To select a desired one of TAP cores 31 and 33, the reset signal input pin TRST is set to logic low. In this interval, predetermined data is input to the shift register circuit 41 through the data input pin TDI. For example, when data "1" and data "0" are sequentially input to the shift register circuit 41 through the data input pin TDI, the shift register circuit 41 sequentially shifts the data "1" and the data "0" in response to the rising edges of a clock signal input through the clock signal input pin TCK. The shifted data is latched by the latch circuit 43.

Next, when the state of the reset signal input pin TRST is transited from logic low to logic high, the data latched by the latch circuit 43 is output in parallel as selection signals SE0 and SE1. That is, the selection signal SE0 is logic "0", and the selection signal SE1 is logic "1". Accordingly, the selector 35 selects the output of the TAP core 33 according to Table 1 and outputs it to the output pin TDO.

Figure 5:
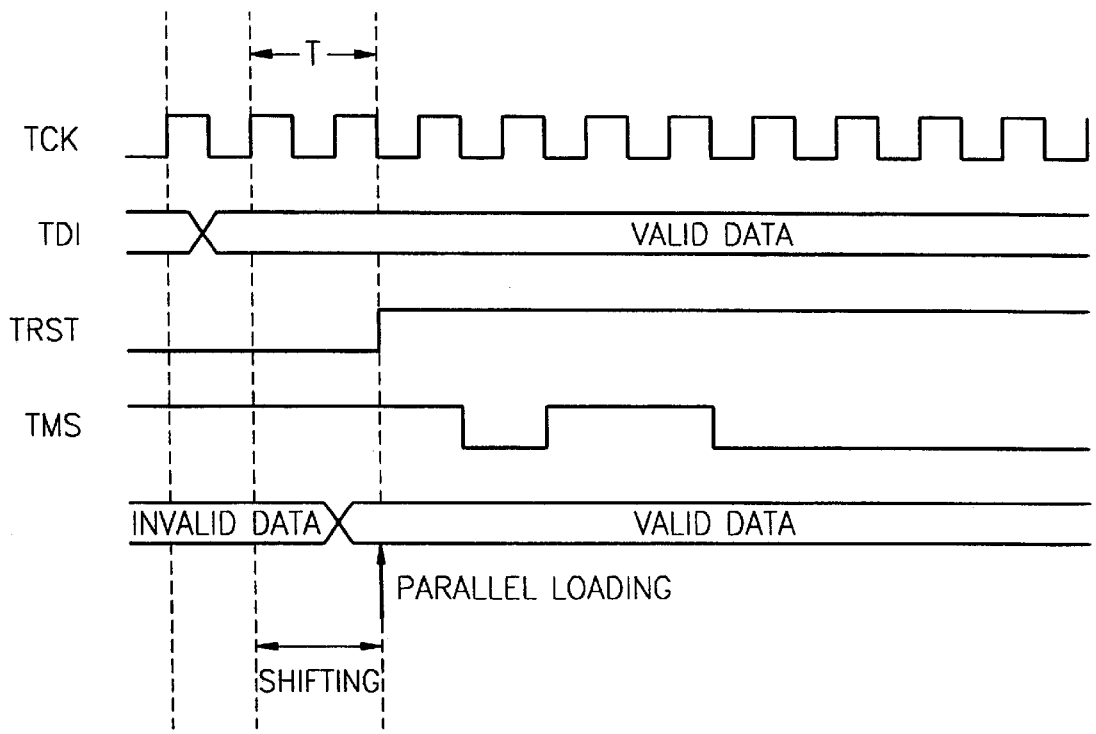
FIG. 5 is a timing diagram of the operation of the semiconductor integrated circuit of FIG. 3.

FIG. 5 is a timing diagram of the operation of the semiconductor integrated circuit of FIG. 3. As shown in FIG. 5, until the state of the reset signal input pin TRST has transitioned from logic low to logic high, data input through the data input pin TDI should be shifted. Since two one-bit selection signals SE0 and SE1 are used in the embodiment shown in FIG. 3, the data should be shifted two times.

Here, the selection signals SE0 and SE1 output from the selection signal generating circuit 39 are invalid before being updated. The state of the test mode signal input pin TMS is preferably maintained at logic high until the state of the reset signal input pin TRST is transitioned from logic low to logic high.

As described above, in an integrated circuit according to the present invention, each TAP core can be selected by the selection signal generating circuit 39 and the selector 35 without being provided with additional pins. Therefore, every TAP core included in the integrated circuit can be tested on a chip, and the integrated circuit according to the present invention can satisfy the IEEE 1149.1 standard. In addition, in the integrated circuit according to the present invention, the boundary scan register circuit 37 is connected to all the TAP cores 31 and 33 so that all the TAP cores 31 and 33 can be tested on a circuit board.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. An integrated circuit comprising:
   a plurality of test access port (TAP) cores sharing a predetermined number of input pins, the input pins comprising a test data input pin, a test mode selection signal input pin, a test reset signal input pin, and a test clock signal input pin;
   a boundary scan register circuit having an input port connected to one of the input pins;
   a selection signal generating circuit which has input ports connected to some of the input pins and generates selection signals for selecting one of the plurality of TAP cores and the boundary scan register circuit in response to signals input through the input ports connected to some input pins, the input ports of the selection signal generating circuit being connected to the test data input pin, the test reset signal input pin, and the test clock signal input pin, the selection signal generating circuit comprising:
      a shift register circuit for sequentially shifting data input through the test data input pin in response to a clock signal input through the test clock signal input pin; and
      a latch circuit for latching the data of the shift register circuit in response to a reset signal input through the test reset signal input pin and outputting the latched data as the selection signals; and
   a selector for selecting one of the outputs of the plurality of TAP cores and the boundary scan register circuit in response to the selection signals and outputs the selection to an output pin.

2. The integrated circuit of claim 1, wherein the input port of the boundary scan register circuit is connected to the test data input pin.

3. The integrated circuit of claim 1, wherein the selector is a multiplexer.

4. An integrated circuit, comprising:
   a plurality of test access port (TAP) cores sharing a predetermined number of input pins, the input pins comprising a test data input pin, a test mode selection signal input pin, a test reset signal input pin, and a test clock signal input pin;
   a boundary scan register circuit having an input port connected to one of the input pins;
   a selection signal generating circuit which has input ports connected to some of the input pins and generates selection signals for selecting one of the plurality of TAP cores and the boundary scan register circuit in response to signals input through the input ports connected to some input pins, the input ports of the selection signal generating circuit being connected to the test mode selection signal input pin, the test reset signal input pin, and the test clock signal input pin; and
   a selector for selecting one of the outputs of the plurality of TAP cores and the boundary scan register circuit in response to the selection signals and outputs the selection to an output pin;
   wherein the selection signal generating circuit comprises:
      a shift register circuit for sequentially shifting data input through the test mode selection signal input pin in response to a clock signal input through the test clock signal input pin; and
      a latch circuit for latching the data of the shift register circuit in response to a reset signal input through the test reset signal input pin and outputting the latched data as the selection signals.

5. The integrated circuit of claim 4, wherein the selector is a multiplexer.

6. The integrated circuit of claim 4, wherein the input port of the boundary scan register circuit is connected to the test data input pin.

* * * * *